(12) United States Patent
Choi et al.

(10) Patent No.: US 9,515,028 B2
(45) Date of Patent: Dec. 6, 2016

(54) ARRAY SUBSTRATE, METHOD OF MANUFACTURING THE SAME AND DISPLAY DEVICE

(71) Applicant: BOE TECHNOLOGY GROUP CO., LTD., Beijing (CN)

(72) Inventors: Seungjin Choi, Beijing (CN); Heecheol Kim, Beijing (CN); Youngsuk Song, Beijing (CN); Seongyeol Yoo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/406,427

(22) PCT Filed: Apr. 21, 2014

(86) PCT No.: PCT/CN2014/075818
§ 371 (c)(1),
(2) Date: Dec. 8, 2014

(87) PCT Pub. No.: WO2015/081652
PCT Pub. Date: Jun. 11, 2015

(65) Prior Publication Data
US 2015/0303150 A1 Oct. 22, 2015

(30) Foreign Application Priority Data
Dec. 5, 2013 (CN) .......................... 2013 1 0654865

(51) Int. Cl.
*H01L 23/552* (2006.01)
*H01L 21/77* (2006.01)
(Continued)

(52) U.S. Cl.
CPC ............. *H01L 23/552* (2013.01); *H01L 21/77* (2013.01); *H01L 27/12* (2013.01); *H01L 27/124* (2013.01);
(Continued)

(58) Field of Classification Search
CPC .............................. H01L 23/552; H01L 27/12
(Continued)

(56) References Cited

U.S. PATENT DOCUMENTS 6,559,914 B1 * 5/2003 Jones ................ G02F 1/136209
349/111
6,999,152 B2 2/2006 Park et al.
(Continued)

FOREIGN PATENT DOCUMENTS

CN 101022095 A 8/2007
CN 202796957 U 3/2013
(Continued)

OTHER PUBLICATIONS

International Search Report, International Preliminary Report on Patentability and Written Opinion of the International Searching Authority of PCT/CN2014/075818 in Chinese, mailed Sep. 12, 2014.
(Continued)

*Primary Examiner* — Kenneth Parker
*Assistant Examiner* — Warren H Kilpatrick
(74) *Attorney, Agent, or Firm* — Collard & Roe, P.C.

(57) ABSTRACT

An array substrate and manufacturing method thereof, and a display device are provided. The array substrate comprises a TFT, an isolating layer (M), a pixel electrode (12) and a via (Q) formed through the isolating layer (14). A drain (6) of the TFT is electrically connected with the pixel electrode (12) through the via (Q). A first light blocking layer (14a) is formed on the pixel electrode (12) inside the via (Q). In the
(Continued)

array substrate of the present invention, display effect deterioration due to the light reflection on pixel electrode inside the via is avoided by forming the light blocking layer on the pixel electrode inside the via. At the same time, prior to manufacturing the light blocking layer, a barrier layer is formed first to guarantee no residual of light blocking layer will be left on the substrate, thereby improving display performance of the display device.

20 Claims, 6 Drawing Sheets (51) Int. Cl.
H01L 29/786 (2006.01)
H01L 27/12 (2006.01)
(52) U.S. Cl.
CPC ......... H01L 27/1262 (2013.01); H01L 29/786 (2013.01); H01L 29/78633 (2013.01); *H01L 2924/0002* (2013.01)
(58) Field of Classification Search
USPC .......................................................... 257/72
See application file for complete search history.

(56) References Cited

U.S. PATENT DOCUMENTS

| 7,208,764 | B2 | 4/2007 | Furusawa |
| 7,833,570 | B2* | 11/2010 | Harkleroad ............... G03F 1/14 216/12 |
| 8,519,612 | B2 | 8/2013 | Yoon et al. |
| 2001/0015789 | A1 | 8/2001 | Park et al. |
| 2008/0084603 | A1 | 4/2008 | Song et al. |
| 2013/0155353 | A1* | 6/2013 | Ma .................... G02F 1/136209 349/106 |

FOREIGN PATENT DOCUMENTS

| CN | 103353683 A | 10/2013 |
| CN | 103353699 A | 10/2013 |
| CN | 103681693 A | 3/2014 |
| JP | 2003-315829 A | 11/2003 |
| KR | 2006-0001710 A | 1/2006 |

OTHER PUBLICATIONS

English translation of the International Search Report of PCT/CN2014/075818, mailed Sep. 12, 2014.
English translation of the Written Opinion of the International Searching Authority of PCT/CN2014/075818, mailed Sep. 12, 2014.
Chinese Office Action of Chinese Application No. 201310654865.5, mailed Aug. 28, 2015 with English translation.
Second Chinese Office Action of Chinese Application No. 201310654865.5, mailed Mar. 4, 2016 with English ranslation.
Third Chinese Office Action in Chinese Application No. 201310654865.5, mailed Jun. 1, 2016 with English translation.

* cited by examiner

ARRAY SUBSTRATE, METHOD OF MANUFACTURING THE SAME AND DISPLAY DEVICE

CROSS REFERENCE TO RELATED APPLICATIONS

This application is the National Stage of PCT/CN2014/075818filed on Apr. 21, 2014, which claims priority under 35 U.S.C. §119 of Chinese Application No. 201310654865.5 filed on Dec. 5, 2013, the disclosure of which is incorporated by reference.

TECHNICAL FIELD

Embodiments of the present invention relate to the field of display technology, particularly to an array substrate and a manufacturing method thereof, as well as a display device.

BACKGROUND

TFT-LCDs (Thin Film Transistor Liquid Crystal Displays) have drawn much attention due to small volume, low power consumption and no radiation, and become predominant and widely applied in the flat panel display field.

Figure 1:
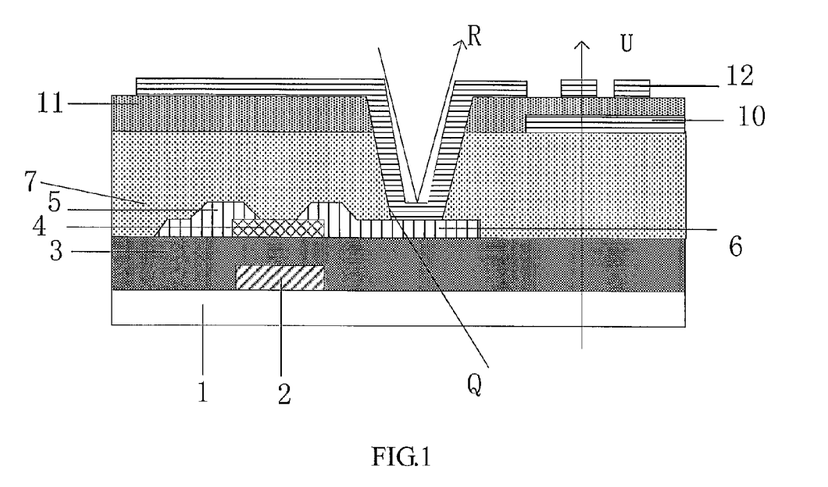
FIG. 1 is a schematic diagram illustrating the reflection of exterior light in a known array substrate.

However, in known TFT array substrates, exterior light would be reflected on pixel electrode layers in via. As illustrated in FIG. 1, the exterior light is incident onto the pixel electrode 12 in via Q and reflected as reflected light R. The reflected light R is mixed with the transmitted light U passing through the substrate, which tends to deteriorate display effect of display devices.

SUMMARY

Embodiments of the present invention provide an array substrate, a display device and a manufacturing method of array substrate that can avoid the reflection of exterior light on pixel electrode inside the via, thereby improving display effect of the display device.

An aspect of the present invention provides an array substrate comprising: a thin film transistor (TFT), an isolating layer, a pixel electrode, and a via penetrating the isolating layer, a drain of the TFT is electrically connected with the pixel electrode through the via, and the first light blocking layer is formed on the pixel electrode inside the via.

Another aspect of the present invention further provides a display device comprising the above-mentioned array substrate.

Yet another aspect of the present invention provides a method of manufacturing an array substrate, comprising:
forming a source and a drain of a TFT on a substrate;
forming an isolating layer on the source and the drain of the TFT and a via penetrating the isolating layer;
forming a pixel electrode on the isolating layer with the via, the pixel electrode being electrically connected with the drain through the via;
forming a first light blocking layer on the pixel electrode inside the via.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. terms such as "on," "under," "right," "left" and the like as used in the patent application specification and the claims of the present invention are only used to indicate relative position relationship, and when the absolute position of the object that is described is changed, the relative position relationship may change accordingly.

In general, embodiments of the present invention provide an array substrate comprising a thin film transistor, an isolating layer, a pixel electrode and a via through the isolating layer. A drain of the thin film transistor is electrically connected with the pixel electrode through the via in the isolating layer, and a first light blocking layer are formed on the pixel electrode in the via.

In this way, the reflection of exterior light on the surface of the pixel electrode inside the via can be avoided by forming the light blocking layer on the pixel electrode. Moreover, prior to the formation of the light blocking layer, a barrier layer is formed first to guarantee no residual of the light blocking layer will be left on the pixel electrode while forming the light blocking layer, thereby improving display performance of the display device.

Figure 2:
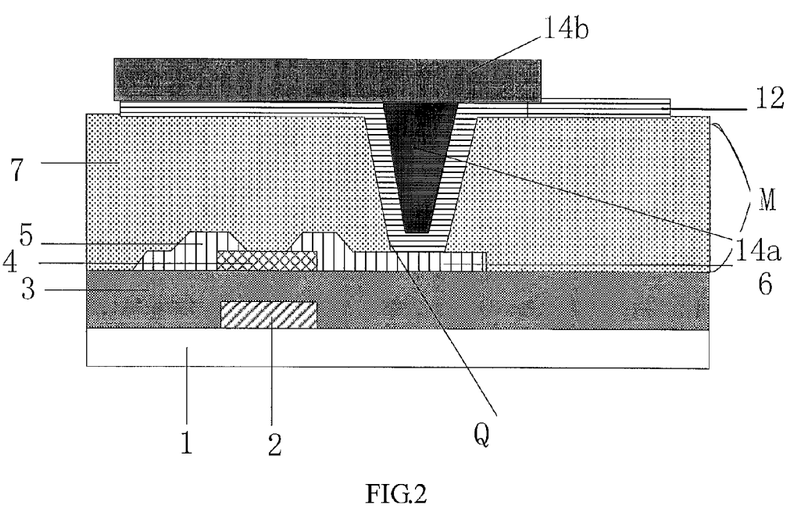
FIG. 2 is a schematically structural diagram of an array substrate provided in an embodiment of the present invention.

Embodiment I:

FIG. 2 is a schematically structural diagram of an array substrate provided in an embodiment of the present invention. The array substrate comprises: a substrate 1, a thin film transistor (which comprises a gate 2, a gate insulating layer 3, a semiconductor layer 4, a source 5 and a drain 6 in this order) formed on the substrate 1, an isolating layer M formed on the substrate 1 with the thin film transistor formed thereon, a via Q penetrating the isolating layer M formed over the drain 6, and a pixel electrode 12 formed on the isolating layer M with the via Q formed therein, where the pixel electrode 12 is electrically connected with the drain 6. The array substrate further comprises: a first light blocking layer 14a formed on the pixel electrode 12 in the via Q.

The isolating layer M may comprise a first protection layer 7 through which the via Q is formed, and the pixel electrode 12 is formed on the first protection layer 7 with the via Q formed therein.

In the embodiment, a first light blocking layer 14a is formed on the pixel electrode 12 in the via Q to block the reflection of exterior light on the pixel electrode 12 in the via Q and improve the display effect.

In one example, the array substrate further comprises a second light blocking layer 14b, which is formed on the first light blocking layer 14a and covers at least a region where the semiconductor layer 4 of the thin film transistor is located. For example, the second light blocking layer 14b is disposed over the semiconductor layer 4, the source 5 as well as the drain 6 of the thin film transistor.

In one example, the second light blocking layer 14b overlap the thin film transistor in orthographic projection direction.

The first light blocking layer 14a is provided for purpose of eliminating reflection of exterior light on the surface of the pixel electrode 12 in the via Q, while the second light blocking layer 14b is provided for purpose of blocking un-modulated light and possibly exterior light as well. The "un-modulated light" refers to the light entering the bottom of the substrate 1 and not changed by the liquid crystal layer in terms of its polarization direction.

Figure 3:
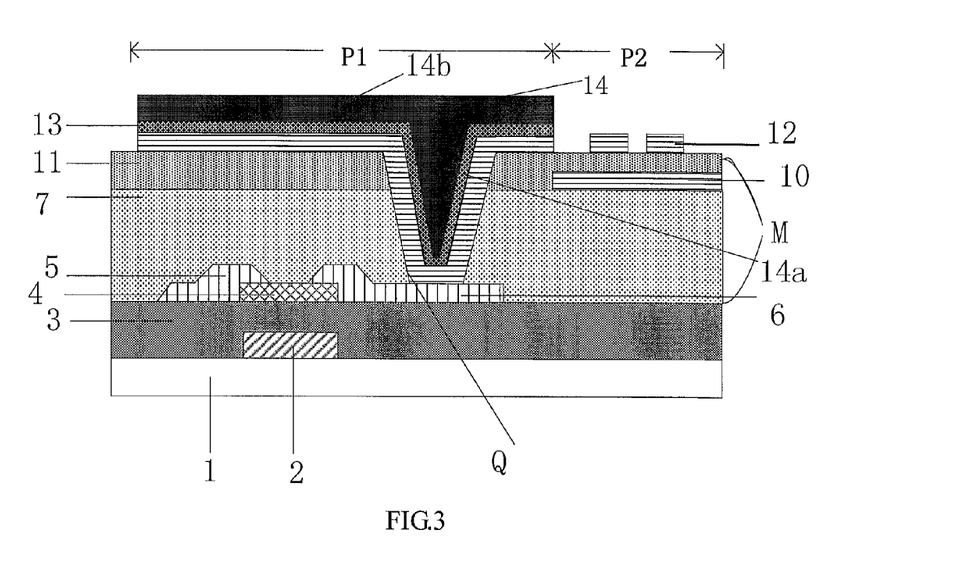
FIG. 3 is a schematically structural diagram of an array substrate provided in another embodiment of the present invention.

Embodiment II:

FIG. 3 is a schematically structural diagram of another array substrate provided in an embodiment of the present invention.

The array substrate comprises: a substrate 1, a thin film transistor (comprising a gate 2, a gate insulating layer 3, a semiconductor layer 4, a source 5 and a drain 6 formed in this order) formed on the substrate 1, an isolating layer M formed on the substrate 1 with the thin film transistor formed thereon, a via Q penetrating the isolating layer M formed over the drain 6, and a pixel electrode 12 formed on the isolating layer M with the via Q formed therein, where the pixel electrode 12 is electrically connected with the drain 6. The array substrate further comprises: a first light blocking layer 14a formed on the pixel electrode 12 in the via Q, and a second light blocking layer 14b. The second light blocking layer 14b overlaps the thin film transistor in the orthographic projection direction in a region P1, namely the region where the thin film transistor locates.

The first light blocking layer 14a and second light blocking layer 14b may be formed integrally as a light blocking layer 14. The first light blocking layer 14a is provided for purpose of eliminating the reflection of exterior light on the surface of the pixel electrode inside the via, while the second light blocking layer 14b are provided for purpose of blocking un-modulated light and possibly exterior light as well. The "un-modulated light" refers to light entering the bottom of the substrate 1 and not changed by the liquid crystal layer in terms of its polarization direction. Therefore, the second light blocking layer 14b overlap the thin film transistor in the orthographic projection direction. While in a practical array substrate, the second light blocking layer 14b may further cover the regions where a plurality of gate lines and a plurality of data lines locate and they are arranged in a matrix (not illustrated). The plurality of gate lines and plurality of data lines may be arranged to cross each other to define a plurality of pixel unit region. Therefore, the light blocking layer 14 which is fabricated by integrally forming the first light blocking layer 14a and the second light blocking layer 14b may further serve as the black matrix.

Figure 4:
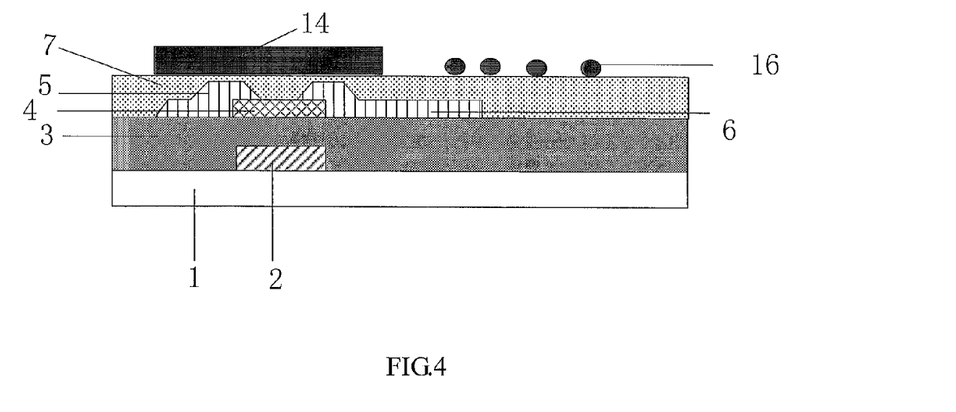
FIG. 4 is a schematic diagram illustrating a residual black matrix phenomenon occurring when forming a black matrix on an array substrate in a known technology.

While forming the black matrix, residual black matrix might occur due to the common manufacturing process. As illustrated in FIG. 4, residues 16 of the black matrix may reduce transmittance of the display panel and finally deteriorate the performance of display products. An embodiment of the present invention further provides an array substrate and a manufacturing method thereof that can avoid residues of black matrix while manufacturing the black matrix and hence improving performance of products.

In order to address residues of black matrix, the array substrate may further comprise a barrier layer 13 formed between the pixel electrode 12 and the first light blocking layer 14a, as illustrated in FIG. 3. In one example, the barrier layer 13 is further formed between the pixel electrode 12 and the second light blocking layer 14b.

In the embodiment, the barrier layer 13 is an auxiliary layer which is used to prevent residues of black matrix in the manufacturing process of the array substrate. The material of the barrier layer 13 is conventional metals or alloys with electrical conductivity, such as Mo, Al, and AlNd. The barrier layer 13 has a transparency and a capability of reflecting exterior light same as that of the pixel electrode 12 or the light blocking layer 14, alternatively, each of the transparency and the capability of reflecting exterior light is between that of the pixel electrode 12 and the light blocking layer 14. Thus, even if the barrier layer 13 contacts the pixel electrode 12, they would not influence parameters of the pixel electrode 12, such as resistance. Therefore, the barrier layer 13 not only will not influence display effect of the display region, but also enhance electrical conductivity of the pixel electrode.

In one example, the isolating layer M comprises a first protection layer 7 and a third protection layer 11, and a common electrode 10, as illustrated in FIG. 3. The first protection layer 7 is formed on the substrate 1 with the thin film transistor formed thereon. The third protection layer 11 is formed on the first protection layer 7. The via Q is formed through both the first protection layer 7 and the third protection layer 11. The pixel electrode 12 is formed on the third protection layer 11 with the via Q formed therein. The common electrode 10 is formed between the first protection layer 7 and the third protection layer 11, and is disposed in the non-TFT region P2 on the first protection layer 7. The non-TFT region P2 is not completely illustrated in FIG. 3, since in a pixel unit, all other regions except for the TFT region P1 are non-TFT region P2.

In this embodiment, the thin film transistor is a bottom gate thin film transistor. The present invention is not limited to the bottom gate thin film transistor, and other type thin film transistors are all applicable to embodiments of the present invention. For example, if the thin film transistor has a top gate configuration, then the first protection layer 7 is equivalent to the gate insulating layer. Furthermore, the "bottom gate thin film transistor" refers to a thin film transistor in which the gate of the thin film transistor is disposed under the semiconductor layer of the thin film transistor. Similarly, "top gate thin film transistor" refers to a thin film transistor in which the gate of the thin film transistor is disposed over the semiconductor layer of the thin film transistor.

The array substrate in the embodiment adopts ADS (ADvanced Super Dimension Switch, abbreviated as ADS) mode, that is, the common electrode and the pixel electrode in different layers are both disposed on the array substrate.

The core technical characteristics of ADS are described as follows. A multi-dimensional electric field is formed with both an electric field produced at edges of a pixel electrode on the same plane and an electric field produced between the pixel electrode layer and a common electrode layer, so that liquid crystal molecules at all orientations, which are located between the pixel electrode and directly above the electrodes in a liquid crystal cell, can be rotated, which enhances the work efficiency of liquid crystal and increases light transmittance efficiency. The ADS technology can improve the picture quality of TFT-LCDs and has advantages of high resolution, high transmissivity, low power dissipation, wide viewing angle, high opening ratio, low chromatic aberration, no push Mura, etc. For different applications, improved technologies of ADS include I-ADS technology with higher transmittance, H-ADS technology with higher aperture opening ratio and S-ADS technology with higher resolution.

It can be conceived that the common electrode in the above-mentioned embodiments may have a plate or slit shape, and so do the pixel electrode. The upper and lower sequence of the pixel electrode and the common electrode may be inverted, and both upper and lower electrodes may have a slit shape. Furthermore, location of the common electrode may vary so long as the multi-dimensional electric field is formed between the common electrode and the pixel electrode, for example, the common electrode is disposed in the same layer as the gate.

It is contemplated that the array substrate in embodiments of the present invention may also adopt traditional TN (Twisted Nematic) mode and IPS mode.

In the embodiment, the barrier layer 13 is formed on the pixel electrode 12 which is in the via Q, and the light blocking layer 14 is formed on the barrier layer 13, thus the reflection of exterior light on the pixel electrode 12 in the via Q can be prevented from influencing display effect. In addition, the light blocking layer 14b formed on the barrier layer 13 further covers the gate lines and data lines on the array substrate to block un-modulated light. At the same time, residues of black matrix can be avoided while manufacturing the black matrix, thereby improving the display performance of the products.

Figure 5:
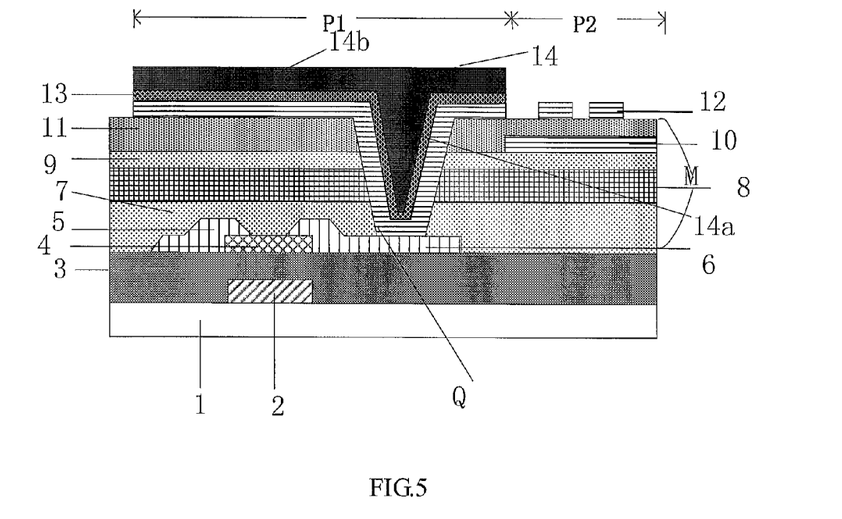
FIG. 5 is a schematically structural diagram of an array substrate provided in yet another embodiment of the present invention.

Embodiment III:

What is different from embodiment II is that the array substrate provided in embodiment III further comprises a color filter layer. As illustrated in FIG. 5, the isolating layer M in the array substrate further comprises a color filter layer 8 and a second protection layer 9. The color filter layer 8 is formed on the first protection layer 7. The second protection layer 9 is formed on the color filter layer 8. The common electrode 10 is formed on the second protection layer 9 in the non-TFT region P2. The third protection layer 11 is formed on the common electrode 10. The via Q penetrates the first protection layer 7, the second protection layer 9, the third protection layer 11 and the color filter layer 8.

The color filter layer 8 may be any one of red filter layer, green filter layer and blue filter layer. For convenience in subsequent manufacturing processes and for purpose of protecting the isolation region between the source and drain of the thin film transistor against contamination, the color filter layer is planarized. That is, the color filter layer 8 not only covers the display region P2 (namely non-TFT region) but also covers the TFT region P1, and the color filter layer 8 in both regions have equal heights.

In the embodiment, the color filter layer 8 is formed on the array substrate. Therefore, in addition to the beneficial effects in embodiment II, the process of manufacturing color filters are eliminated by forming the color filter layer on TFTs, thereby effectively reducing the manufacturing costs.

Figure 6:
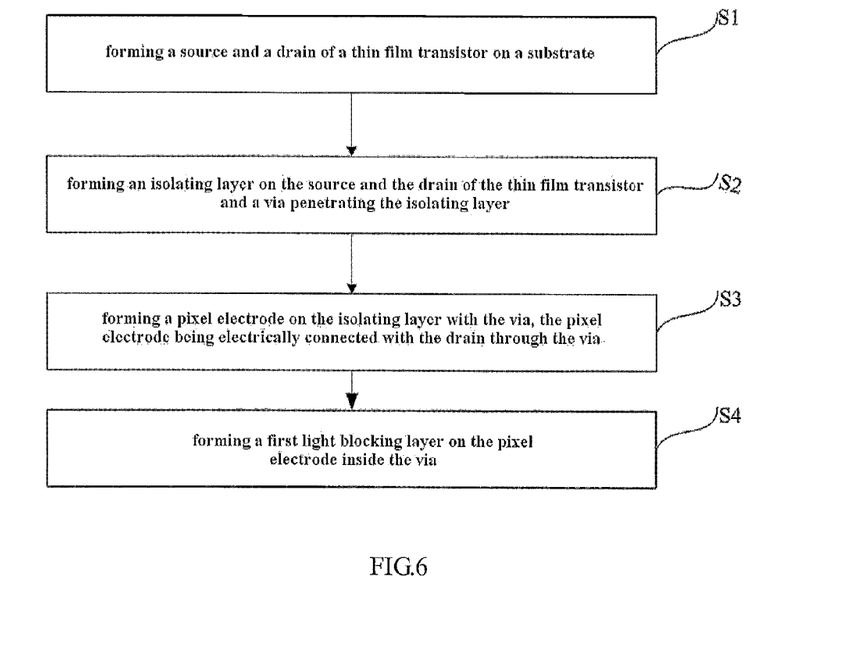
FIG. 6 is a flow chart I of a manufacturing method of an array substrate provided yet another embodiment of the present invention.

Embodiment IV:

A method of manufacturing an array substrate is provided in an embodiment of the present invention, as illustrated in FIG. 6, the method comprises steps of:

S1: forming a source and a drain of a thin film transistor on a substrate;

S2: forming an isolating layer on the source and the drain of the thin film transistor and a via penetrating the isolating layer;

S3: forming a pixel electrode on the isolating layer with the via, the pixel electrode being electrically connected with the drain through the via;

S4: forming a first light blocking layer on the pixel electrode inside the via.

The manufacturing method of the embodiment may be used for manufacturing the array substrate in embodiment III and will be described in detail below with reference to FIGS. 5-12.

In one example, the method of manufacturing an array substrate comprises the following steps:

S1, a pattern of a source 5 and a drain 6 of a thin film transistor is formed on the substrate 1.

A thin film transistor in the embodiment is a top gate thin film transistor or a bottom gate thin film transistor. It may also be other type thin film transistor. When a top gate thin film transistor is adopted, the gate is disposed over the isolating layer M. For better description, a bottom gate thin film transistor will be described as an example in the embodiment. As illustrated in FIG. 5, the thin film transistor comprises a gate 2, a gate insulating layer 3, a semiconductor layer 4 and a source 5 and a drain 6. In order to form the array substrate illustrated in FIG. 5, step S1 comprises:

forming a gate metal film on the substrate 1, and then forming the gate 2 by one patterning process;

forming a gate insulating layer film and a semiconductor layer film in this order on the substrate 1 with the gate 2 formed thereon, and then forming both the gate insulating layer 3 and the semiconductor layer 4 by one patterning process; and forming a source/drain metal film on the substrate with the semiconductor layer 4 formed thereon, and then forming the source 5 and the drain 6 by one patterning process.

It is contemplated that step S1 may also be implemented in other ways which are not limited to the above-mentioned way. For example, the gate insulating layer, the pattern of the semiconductor layer and the pattern of the source/drain electrode are formed in same and one patterning process.

A patterning process may comprise film formation, photoresist application, exposure, development and etching. Film formation methods may be conventional process methods such as coating, deposition including plasma enhanced chemical vapor deposition (PECVD), sputtering including magnetron sputtering.

The gate metal film or the source/drain metal film may be a single layer which is made of molybdenum, aluminum, molybdenum tungsten alloy, chromium or copper, and may also be a laminated layer which is made of at least two of the above-mentioned materials. The material for the semiconductor layer may be amorphous silicon, low temperature polysilicon or oxide semiconductor. The material for the gate insulating layer film may be silicon nitride, and may also be silicon oxide and silicon oxynitride etc.

S2, an isolating layer M and a via Q penetrating the isolating layer M are formed over the source 5 and the drain 6 of the thin film transistor.

The isolating layer M may comprise a first protection layer 7, a color filter layer 8, a second protection layer 9, a common electrode 10 and a third protection layer 11 formed in this order. The common electrode 10 is formed in the non-TFT region P2 and between the second protection layer 9 and the third protection layer 11. In one example, step S2 comprises:

forming a first protection layer 7 on the substrate 1 with the thin film transistor formed thereon;

forming a color filter layer film on the first protection layer 7 and then forming the color filter layer 8 by one patterning process;

forming a second protection layer 9 on the color filter layer 8;

forming a common electrode film on the second protection layer 9 and then forming the common electrode 10 at locations corresponding to non-TFT regions P2 by one patterning process;

forming a third protection layer 11 on the second protection layer 9 with the common electrode 10 formed thereon;

forming a via Q penetrating each of the first protection layer 7, the color filter layer 8, the second protection layer 9 and the third protection layer 11 over the drain 6 of the thin film transistor by one patterning process.

It is contemplated that step S2 may also be implemented in other ways which are not limited to the above-mentioned way. For example, the via penetrating the first protection layer 7, the color filter layer 8, the second protection layer 9 and the third protection layer 11 may consist of a plurality of through-holes in individual layers which may be formed in same corresponding regions and may also be formed in different regions. Furthermore, these holes may be formed with one patterning process, and may also be formed with different patterning processes. Therefore, it is acceptable as long as the pixel electrode is electrically connected with the drain through the via which penetrates each of the first protection layer 7, the color filter layer 8, the second protection layer 9 and the third protection layer 11.

The material for the protection layers is typically silicon nitride (SiNx) or resin. The common electrode is typically made of transparent conductive material such as ITO or IZO. The color filter layer may comprise red (R), green (G) and blue (B) color filter layers.

S3, a pixel electrode 12 is formed on the isolating layer M with the via Q formed therein, which are electrically connected with the drain 6 through the via Q.

S4, a first light blocking layer 14a is formed on the pixel electrode 12 inside the via Q.

In one example, the method further comprises: forming a second light blocking layer 14b on the first light blocking layer 14a, the second light blocking layer 14b covers at least a region in which the semiconductor layer 4 of the thin film transistor is located.

In one example, the method further comprises: forming a second light blocking layer 14b on the first light blocking layer 14a, the second light blocking layer 14b overlaps the thin film transistor in the orthographic projection direction.

The first light blocking layer 14a and the second light blocking layer 14b may be formed integrally as the light blocking layer 14.

In one example, the method further comprises: forming a barrier layer 13 between the pixel electrode 12 and the light blocking layer 14.

In this embodiment, the pixel electrode 12 and the first light blocking layer 14a may be formed using one patterning process. Alternatively, the pixel electrode 12, the barrier layer 13 and the light blocking layer 14 may be formed using one patterning process, in this case, the above-mentioned steps S3 and S4 may be merged as one step for explanation.

Figure 7:
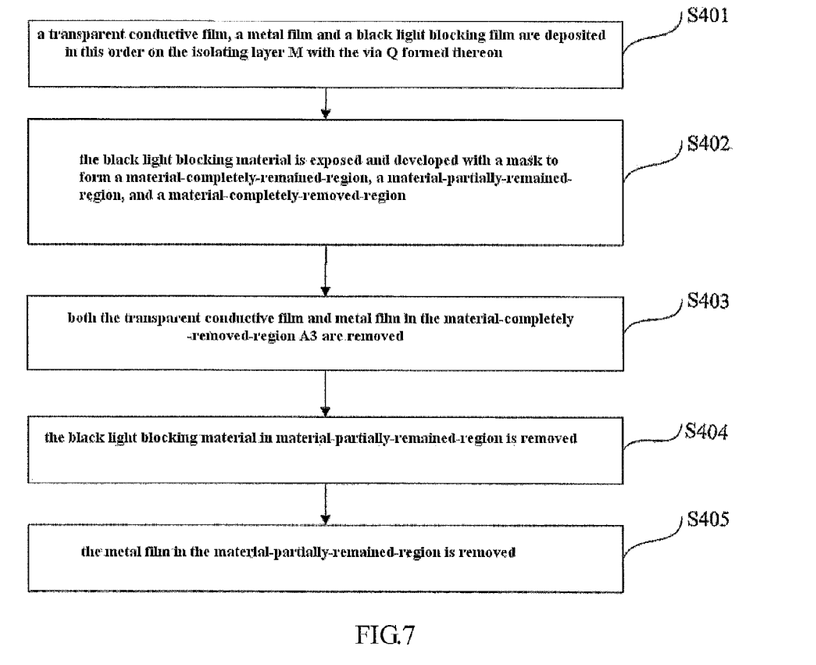
FIG. 7 is a flow chart II of a manufacturing method of an array substrate provided in an embodiment of the present invention.
Figure 8:
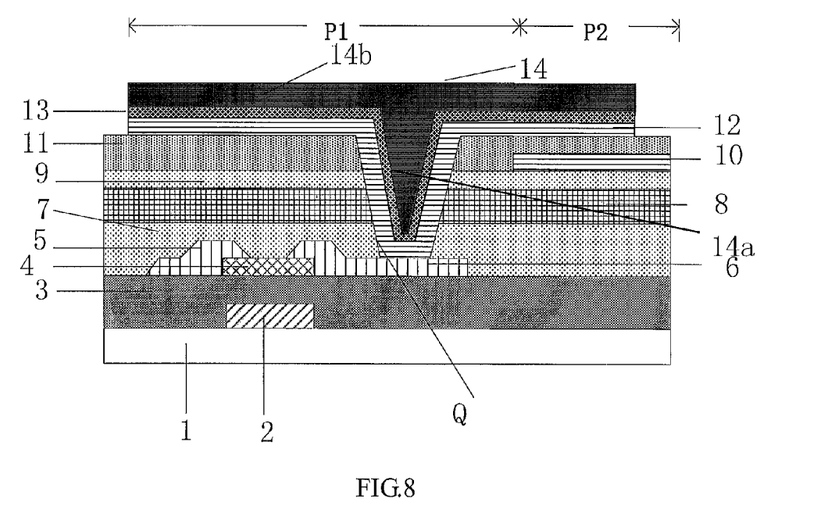
FIG. 8 is a schematic diagram I of a manufacturing process of an array substrate provided in an embodiment of the present invention.

Description will be given below with the pixel electrode 12, the barrier layer 13 and the light blocking layer 14 formed with one patterning process as an example. As illustrated in FIG. 7, the step of forming patterns of the pixel electrode 12, the barrier layer 13 and the light blocking layer 14 with one patterning process on the substrate with the isolating layer M (having the via Q) formed thereon comprises:

S401, as illustrated in FIG. 8, a transparent conductive film, a metal film and a black light blocking film are deposited in this order on the isolating layer M with the via Q formed thereon.

The transparent conductive metal film is of transparent conductive material such as ITO or IZO and is used for forming the pixel electrode. The metal film is of conductive metal material such as Cu, Al, Nd, Al—Nd or alloys thereof and used for forming the barrier layer 13. The black light blocking film is of a black light blocking material such as Cr and used for forming the light blocking layer 14.

Figure 9:
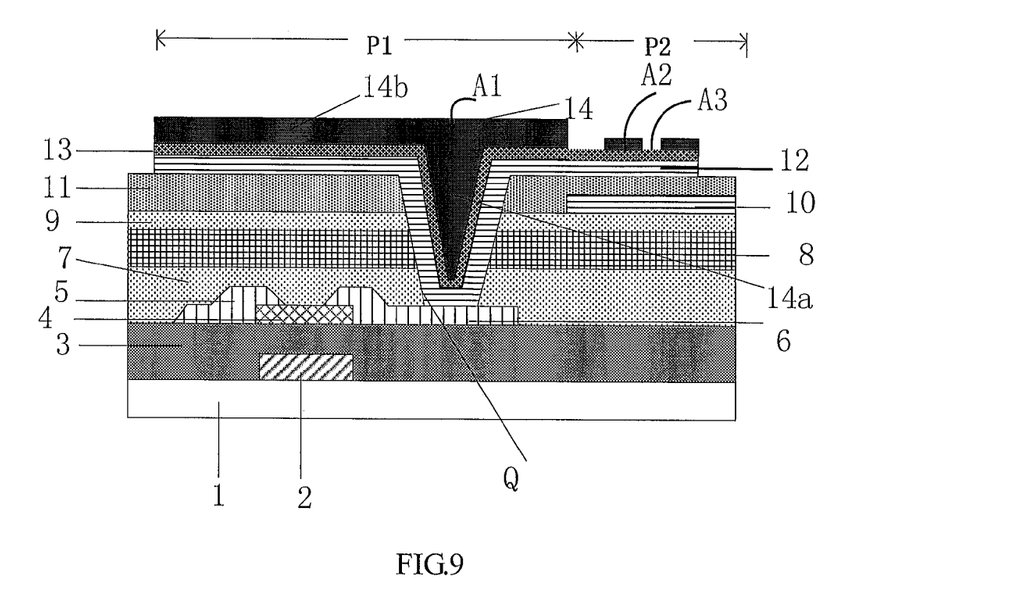
FIG. 9 is a schematic diagram II of a manufacturing process of an array substrate provided in an embodiment of the present invention.

S402, as illustrated in FIG. 9, the black light blocking material is exposed and developed with a mask to form a material-completely-remained-region A1, a material-partially-remained-region A2 and a material-completely-removed-region A3.

The mask is a half-tone mask or a gray-tone mask. The material-completely-remained-region A1 corresponds to the TFT region, the material-partially-remained-region A2 corresponds to a predetermined slit-shaped pixel electrode region, and the material-completely-removed-region A3 corresponds to the remaining region.

Figure 10:
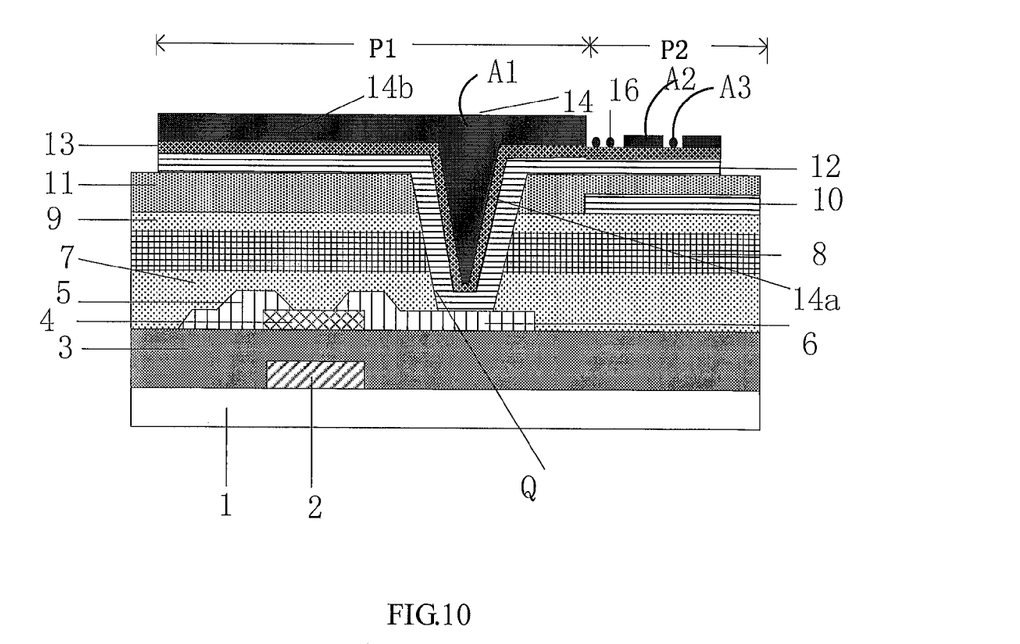
FIG. 10 is a schematic diagram III of a manufacturing process of an array substrate provided in an embodiment of the present invention.

As illustrated in FIG. 10, due to defects in traditional manufacturing process, when forming the pattern of black light blocking layer, some black light blocking material, namely black matrix residues 16 will left in the material-completely-removed-region A3, which are likely to reduce transmittance and in turn influence display effect.

Figure 11:
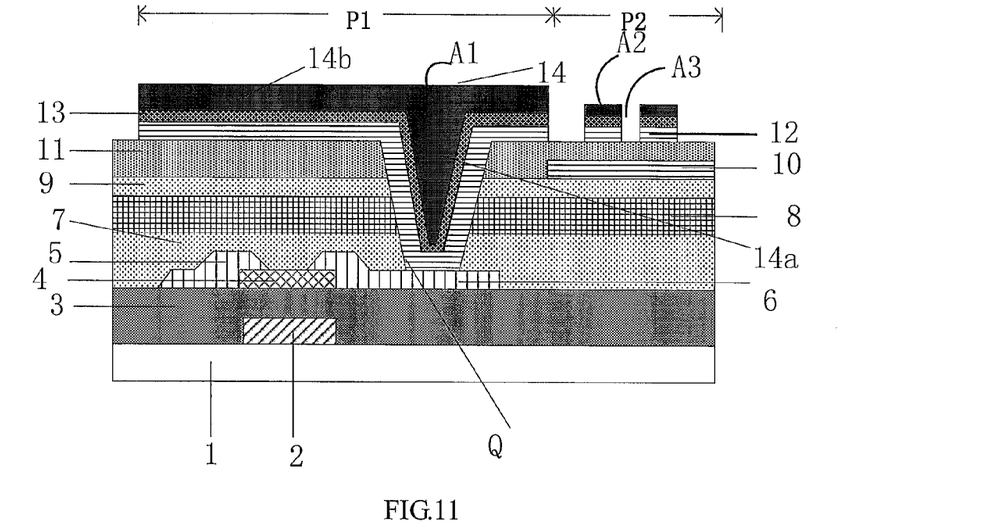
FIG. 11 is a schematic diagram IV of a manufacturing process of an array substrate provided in an embodiment of the present invention.

S403, as illustrated in FIG. 11, both the transparent conductive film and metal film in the material-completely-removed-region A3 are removed. For example, the metal film in the material-completely-removed-region A3 is etched with etching process, and then the transparent conductive film in the material-completely-removed-region A3 is etched with etching process.

When the metal film is etched, the black matrix residues 16 left on the metal film are removed together with the metal film, thereby avoiding residual phenomenon of black matrix on the array substrate.

It is contemplated that the metal film and the transparent conductive film may also be etched at the same time. For example, the transparent conductive material and the metal film can be etched simultaneously with an etchant containing nitric acid, hydrochloric acid, hydrogen peroxide and azoles compounds. For example, the transparent conductive film is formed of ITO, and the metal film is formed of copper or copper alloy.

Figure 12:
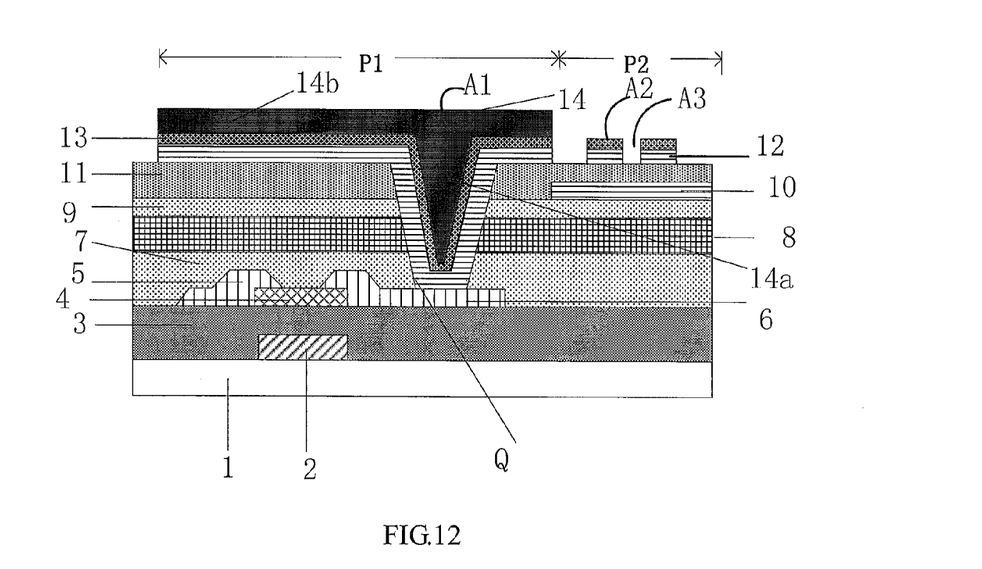
FIG. 12 is a schematic diagram V of a manufacturing process of an array substrate provided in an embodiment of the present invention.

S404, as illustrated in FIG. 12, the black light blocking material in the material-partially-remained-region A2 is removed. For example, the black light blocking film in material-partially-remained-region A2 is removed by ashing process.

Now, the black light blocking material in material-completely-remained-region A1 is thinned to finally form the desired pattern of the light blocking layer 14 on the array substrate.

S405, as illustrated in FIG. 5, the metal film in the material-partially-remained-region A2 is removed. For example, the metal film in the material-partially-remained-region A2 is removed by etching process.

The patterns of the pixel electrode 12, the barrier layer 13 and the light blocking layer 14 are formed after removing the metal film in the material-partially-remained-region A2 (namely on pixel electrode 12) by etching process.

In summary, the manufacturing method of array substrate provided in embodiment IV of the present invention not only prevents exterior light from being reflected in the via, but also forms the pixel electrode, the barrier layer and the light blocking layer in same and one patterning process, which not only reduces the number of patterning processes, but also avoid residual phenomenon of light blocking material (black matrix) possibly occurring in the manufacturing process, thereby improving the display effect.

Embodiment V:

The display device provided in an embodiment of the present invention comprises an array substrate of embodiment I, II, or III, or manufactured by the method of embodiment IV, which will not be described any more here.

The display device may be for example a liquid crystal display, an OLED display, an electronic paper and other display devices driven with the array substrate.

Embodiments of the present invention improve the display effect by addressing the reflection problem of exterior light incident on the pixel electrode in the via. At the same time, in the manufacturing method provided in embodiments of the present invention, the pixel electrode, the barrier layer and the light blocking layer can be formed using same and one patterning process, which not only reduces the number of patterning processes, but also prevent the light blocking material from remaining on the array substrate.

What are described above is related to the illustrative embodiments of the disclosure only and not limitative to the scope of the disclosure; the scopes of the disclosure are defined by the accompanying claims.

The invention claimed is:

1. An array substrate comprising: a thin film transistor (TFT), an isolating layer, a pixel electrode, and a via penetrating the isolating layer, wherein a drain of the TFT is electrically connected with the pixel electrode through the via, and the first light blocking layer is formed on the pixel electrode inside the via.

2. The array substrate of claim 1, further comprising: a second light blocking layer which is formed on the first light blocking layer and covers at least a region where a semiconductor layer of the TFT is located.

3. The array substrate of claim 1, further comprising: a second light blocking layer overlapping the TFT in an orthographic projection direction.

4. The array substrate of claim 2, wherein the first light blocking layer and the second light blocking layer are formed integrally.

5. The array substrate of claim 2, further comprising: a barrier layer formed between the pixel electrode and the first light blocking layer.

6. The array substrate of claim 5, wherein the barrier layer is further formed between the pixel electrode and the second light blocking layer.

7. The array substrate of claim 1, wherein the isolating layer comprises a first protection layer, a color filter layer and a second protection layer, wherein the color filter layer is formed between the first protection layer and the second protection layer.

8. The array substrate of claim 7, wherein the isolating layer further comprise a common electrode and a third protection layer, wherein the third protection layer is formed between the common electrode and the pixel electrode.

9. The array substrate of claim 1, wherein the TFT is a bottom gate TFT.

10. A display device, comprising an array substrate according to claim 1.

11. A method of manufacturing an array substrate, comprising:
    forming a source and a drain of a TFT on a substrate;
    forming an isolating layer on the source and the drain of the TFT and a via penetrating the isolating layer;
    forming a pixel electrode on the isolating layer with the via, the pixel electrode being electrically connected with the drain through the via;
    forming a first light blocking layer on the pixel electrode inside the via.

12. The method of manufacturing an array substrate of claim 11, further comprising: forming a second light blocking layer on the first light blocking layer, the second light blocking layer covering at least a region where a semiconductor layer of the TFT is located.

13. The method of manufacturing an array substrate of claim 11, further comprising: forming a second light blocking layer on the first light blocking layer, the second light blocking layer overlapping the TFT in an orthographic projection direction.

14. The method of manufacturing an array substrate of claim 12, wherein the first light blocking layer and the second light blocking layer are formed integrally as a light blocking layer.

15. The method of manufacturing an array substrate of claim 14, further comprising: forming a barrier layer between the pixel electrode and the light blocking layer.

16. The method of manufacturing an array substrate of claim 15, wherein the pixel electrode, the barrier layer and the light blocking layer are formed with one patterning process.

17. The method of manufacturing an array substrate of claim 16, wherein forming the pixel electrode, the barrier layer and the light blocking layer with one patterning process comprises:
    forming a transparent conductive film, a metal film and a black light blocking material film in this order on the isolating layer with the via;

exposing and developing the black light blocking material with a mask to form a material-completely-remained-region, a material-partially-remained-region and a material-completely-removed-region; wherein the material-completely-remained-region corresponds to the TFT regions, the material-partially-remained-region corresponds to a predetermined slit-shaped pixel electrode region, and the material-completely-removed-region corresponds to the remaining region;

removing the transparent conductive film and the metal film in the material-completely-removed-region;

removing the black light blocking material film in the material-partially-remained-region; and removing the metal film in the material-partially-remained-region.

18. The method of manufacturing an array substrate of claim 17, wherein the mask is a half-tone mask or a gray-tone mask.

19. The method of manufacturing an array substrate of claim 11, further comprising: forming a barrier layer between the pixel electrode and the first light blocking layer.

20. The array substrate of claim 3, wherein the first light blocking layer and the second light blocking layer are formed integrally.

* * * * *